US012622131B2

(12) United States Patent
Wu

(10) Patent No.: US 12,622,131 B2
(45) Date of Patent: May 5, 2026

(54) ORGANIC ELECTROLUMINESCENT DEVICE, DISPLAY PANEL, AND DISPLAY APPARATUS

(71) Applicant: BOE Technology Group Co., Ltd., Beijing (CN)

(72) Inventor: Yong Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 982 days.

(21) Appl. No.: 17/789,700

(22) PCT Filed: Aug. 4, 2021

(86) PCT No.: PCT/CN2021/110673
§ 371 (c)(1),
(2) Date: Jun. 28, 2022

(87) PCT Pub. No.: WO2022/062699
PCT Pub. Date: Mar. 31, 2022

(65) Prior Publication Data

US 2023/0092444 A1 Mar. 23, 2023

(30) Foreign Application Priority Data

Sep. 23, 2020 (CN) ......................... 202011012901.4

(51) Int. Cl.
*H10K 50/12* (2023.01)
*H10K 85/60* (2023.01)
(Continued)

(52) U.S. Cl.
CPC ......... *H10K 50/121* (2023.02); *H10K 85/631* (2023.02); *H10K 85/636* (2023.02);
(Continued)

(58) Field of Classification Search
None
See application file for complete search history.

(56) References Cited

U.S. PATENT DOCUMENTS

2019/0386235 A1 12/2019 Duan et al.
2021/0071070 A1 3/2021 Qiao et al.
2021/0234113 A1* 7/2021 Adachi ................. H10K 50/10

FOREIGN PATENT DOCUMENTS

CN 105870347 A 8/2016
CN 107808931 A 3/2018
(Continued)

OTHER PUBLICATIONS

Colella, M., Pander, P., Pereira, D. D. S., & Monkman, A. P. (2018). Interfacial TADF exciplex as a tool to localize excitons, improve efficiency, and increase OLED lifetime. ACS applied materials & interfaces, 10(46), 40001-40007. (Year: 2018).*
(Continued)

*Primary Examiner* — Dawn L Garrett
(74) *Attorney, Agent, or Firm* — IPro, PLLC

(57) ABSTRACT

Provided are an organic electroluminescent device, a display panel, and a display apparatus. An exciton layer adjacent to a light-emitting layer is added, and the exciton layer serves as an exciton recombination region and achieves the effect of increasing the density of excitons, where the singlet-state energy level of the exciton layer is higher than the singlet-state energy level of a host material in the light-emitting layer, and an emission spectrum of the exciton layer and an absorption spectrum of the host material in the light-emitting layer have an overlapping area. Moreover, the exciton layer allows triplet-state excitons formed in the exciton layer to form singlet-state excitons via a reverse intersystem crossing process.

14 Claims, 5 Drawing Sheets

(51) Int. Cl.
*H10K 101/30* (2023.01)
*H10K 102/00* (2023.01)

(52) U.S. Cl.
CPC ....... *H10K 85/654* (2023.02); *H10K 85/6572* (2023.02); *H10K 85/6574* (2023.02); *H10K 2101/30* (2023.02); *H10K 2102/351* (2023.02)

(56) References Cited

FOREIGN PATENT DOCUMENTS

| | | | |
|---|---|---|---|
| CN | 108039417 | A | 5/2018 |
| CN | 109817836 | A | 5/2019 |
| CN | 112117388 | A | 12/2020 |
| JP | 2020140956 | A | 9/2020 |

OTHER PUBLICATIONS

Seino, Y., Inomata, S., Sasabe, H., Pu, Y. J., & Kido, J. (2016). High-performance green OLEDs using thermally activated delayed fluorescence with a power efficiency of over 100 Im W—1. Advanced Materials, 28(13), 2638-2643. (Year: 2016).*

* cited by examiner

ORGANIC ELECTROLUMINESCENT DEVICE, DISPLAY PANEL, AND DISPLAY APPARATUS

CROSS REFERENCE TO RELATED APPLICATIONS

The present disclosure is a National Stage of International Application No. PCT/CN2021/110673, filed Aug. 4, 2021, which claims priority to the Chinese Patent Application No. 202011012901.4, entitled "ORGANIC ELECTROLUMINESCENT DEVICE, DISPLAY PANEL, AND DISPLAY APPARATUS", and filed to the China National Intellectual Property Administration on Sep. 23, 2020, the entire contents of which are incorporated herein by reference.

FIELD

The present disclosure relates to the technical field of display, in particular to an organic electroluminescent device, a display panel and a display apparatus.

BACKGROUND

In recent years, an organic light-emitting display (OLED), as a new type of flat panel display, has attracted more and more attention. Because of features including active lighting, high brightness, high resolution, wide viewing angle, fast response, color saturation, lightness and thinness, low energy consumption, flexibility and the like, it is known as a dream display, and has become a hot mainstream display product in the market.

SUMMARY

In an aspect, an embodiment of the present disclosure provides an organic electroluminescent device, including:

an anode and a cathode, arranged in opposite;

a light-emitting layer, between the anode and the cathode; and an exciton layer adjacent to the light-emitting layer in a direction pointing from the anode to the cathode; where the exciton layer includes at least one compound, the exciton layer allows triplet-state excitons formed in the exciton layer to form singlet-state excitons via a reverse intersystem crossing, a singlet-state energy level of the exciton layer is higher than a singlet-state energy level of a host material in the light-emitting layer, and an overlap ratio between an emission spectrum of the exciton layer and an absorption spectrum of the host material in the light-emitting layer is greater than a set value.

In some embodiments, the overlap ratio between the emission spectrum of the exciton layer and the absorption spectrum of the host material in the light-emitting layer is greater than 5%.

In some embodiments, the exciton layer includes one compound, and the compound has a characteristic of emitting thermally activated delayed fluorescence.

In some embodiments, the exciton layer includes an exciplex formed by mixing a first compound and a second compound, and an exciton yield of the exciplex is greater than 50%.

In some embodiments, a mass ratio of the first compound to the second compound ranges from 1:9 to 9:1.

In some embodiments, an electron mobility of the host material in the light-emitting layer is greater than a hole mobility of the host material in the light-emitting layer, and the exciton layer is disposed on a side of the light-emitting layer facing the anode; or the electron mobility of the host material in the light-emitting layer is smaller than the hole mobility of the host material in the light-emitting layer, and the exciton layer is disposed on a side of the light-emitting layer facing the cathode.

In some embodiments, the organic electroluminescent device further includes: at least one auxiliary function layer disposed on a side of the exciton layer facing away from the light-emitting layer; and the singlet-state energy level of the exciton layer is smaller than a singlet-state energy level of an adjacent auxiliary function layer of the at least one auxiliary function layer.

In some embodiments, the organic electroluminescent device further includes: at least one auxiliary function layer disposed on a side of the exciton layer facing away from the light-emitting layer; and an Lowest Unoccupied Molecular Orbital, LUMO, value of the at least one compound in the exciton layer is greater than an LUMO value of an adjacent auxiliary function layer of the at least one auxiliary function layer.

In some embodiments, an absolute value of a difference between the LUMO value of the at least one compound in the exciton layer and the LUMO value of the adjacent auxiliary function layer is greater than 0.3 eV; and an absolute value of a difference between an Highest Occupied Molecular Orbital, HOMO, value of the at least one compound in the exciton layer and an HOMO value of the adjacent auxiliary function layer is smaller than 0.5 eV.

In some embodiments, when the exciton layer is disposed on the side of the light-emitting layer facing the anode, the at least one auxiliary function layer includes at least one of following: a hole injection layer, a hole transport layer or an electron blocking layer; or when the exciton layer is disposed on the side of the light-emitting layer facing the cathode, the at least one auxiliary function layer includes at least one of following: an electron injection layer, an electron transport layer or a hole blocking layer.

In some embodiments, a thickness of the exciton layer is smaller than or equal to 20 nm.

In another aspect, an embodiment of the present disclosure further provides a display panel, including a plurality of the above organic electroluminescent devices provided by the embodiment of the present disclosure.

In another aspect, an embodiment of the present disclosure further provides a display apparatus, including the above display panel provided by the embodiment of the present disclosure.

DETAILED DESCRIPTION OF THE EMBODIMENTS

Figure 1:
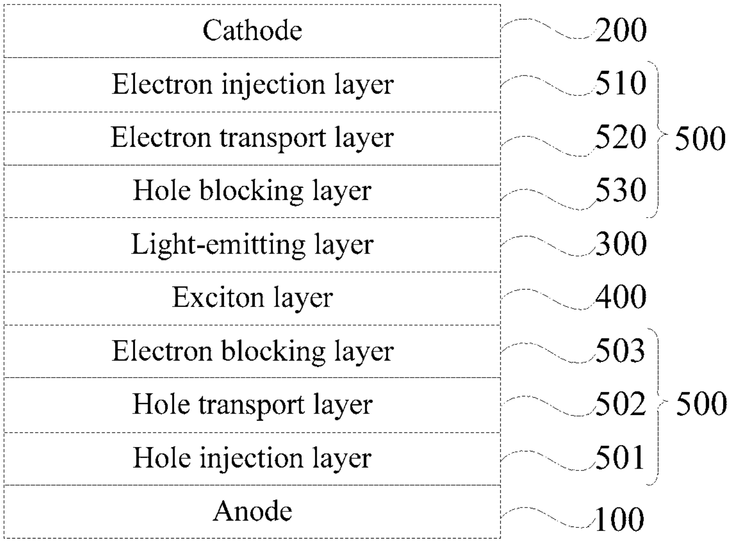
FIG. 1 is a schematic structural diagram of an organic electroluminescent device provided by an embodiment of the present disclosure.

In order to make objectives, technical solutions and advantages of embodiments of the present disclosure clearer, the technical solutions of embodiments of the present disclosure will be clearly and completely described below with reference to the accompanying drawings of the embodiments of the present disclosure. It should be noted that the sizes and shapes of various patterns in the accompanying drawings do not reflect the true ratio, and are only intended to illustrate the content of the present disclosure schematically. In addition, the same or similar numerals refer to the same or similar elements or elements having the same or similar functions throughout. Obviously, the described embodiments are some, but not all, embodiments of the present disclosure. Based on the embodiments in the present disclosure, all other embodiments acquired by those of ordinary skill in the art without creative work shall fall within the protection scope of the present disclosure.

Unless otherwise defined, technical or scientific terms used herein should have the ordinary meaning as understood by those of ordinary skill in the art to which the present disclosure belongs. The terms "first", "second" and the like used in the description and claims of the present disclosure do not denote any order, quantity or importance, but are only used to distinguish different components. "Comprise" or "include" and similar words mean that the elements or objects appearing before the word encompass the elements or objects recited after the word and their equivalents, but do not exclude other elements or objects. "Inside", "outside", "up", "down" and the like are only used to indicate the relative positional relationship, and when the absolute position of the described object changes, the relative positional relationship may also change accordingly.

Organic light-emitting diodes (OLEDs) have the advantages of autonomous light emission, flexibility, energy saving, ultra-thinness and less weight. Usually, when a voltage is applied to an OLED, holes are injected from an anode, electrons are injected from a cathode, the electrons and the holes are compounded in a light-emitting layer to form excitons, and according to a statistical law of spin, singlet-state excitons and triplet-state excitons are generated in a ratio of 25%:75%. Conventional fluorescent OLEDs only use singlet-state excitons to emit light, so 25% of its internal quantum efficiency (IQE) is a theoretical limit, which greatly limits the efficiency of the fluorescent OLEDs. On the other hand, the performance of phosphorescent OLEDs is unsatisfactory due to the limitations of energy level matching, carrier balance, device structure, light output efficiency and so on.

In the field of organic light-emitting, the conventional fluorescent organic light-emitting diodes (FOLEDs) have more advantages than the phosphorescent OLEDs and thermally activated delayed fluorescence (TADF) OLEDs. Compared with the phosphorescent and TADF light-emitting devices, emission spectrums of the conventional FOLEDs are narrower, which is beneficial to obtaining color purity; and short lifetime of emitted excitons is also an important advantage, which can increase a working life of the OLEDs and reduce roll-off, but the theoretical limit of the efficiency of the fluorescent OLEDs is relatively low and unsatisfactory. Therefore, for the OLEDs, how to improve the device efficiency is one of key issues to improving the device performance.

Figure 2:
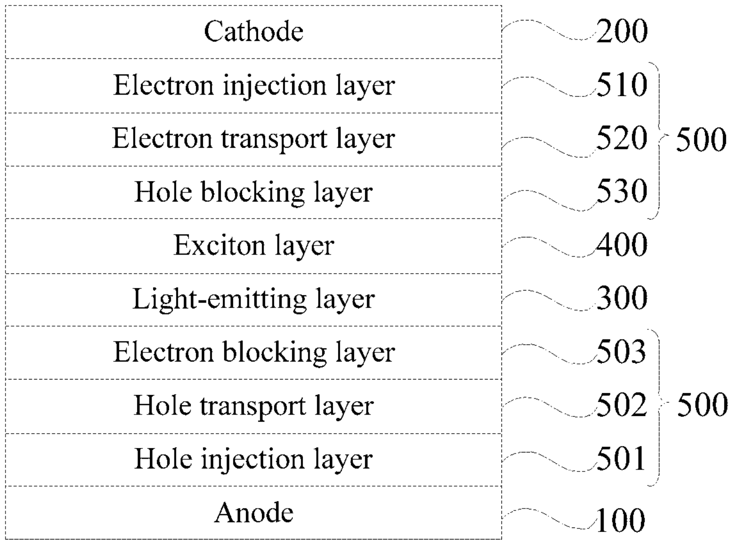
FIG. 2 is another schematic structural diagram of an organic electroluminescent device provided by an embodiment of the present disclosure.

An organic electroluminescent device provided by an embodiment of the present disclosure, as shown in FIG. 1 and FIG. 2, includes: an anode 100 and a cathode 200 arranged in opposite, a light-emitting layer 300 between the anode 100 and the cathode 200, and an exciton layer 400 adjacent to the light-emitting layer 300 in a direction pointing from the anode 100 to the cathode 200.

The exciton layer 400 includes at least one compound, the exciton layer 400 allows triplet-state excitons formed in the exciton layer to form singlet-state excitons via a reverse intersystem crossing process, a singlet-state energy level of the exciton layer 400 is higher than a singlet-state energy level of a host material in the light-emitting layer 300, and an overlap ratio between an emission spectrum PL of the exciton layer 400 and an absorption spectrum Abs of the host material in the light-emitting layer 300 is greater than a set value.

Figure 3:
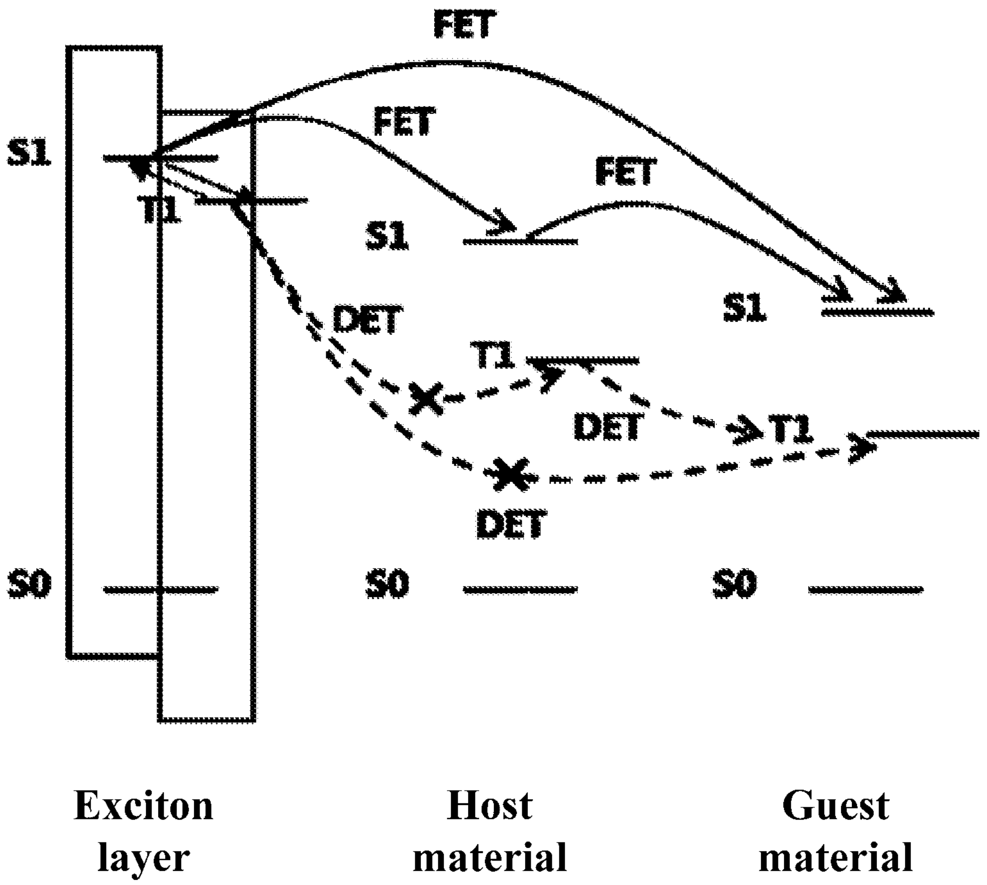
FIG. 3 is a diagram of an energy level relation of an organic electroluminescent device provided by an embodiment of the present disclosure.

In some embodiments, the exciton layer 400 adjacent to the light-emitting layer 300 is added, it may be considered that the exciton layer 400 and the light-emitting layer 300 are arranged in a stacked mode, and areas of the exciton layer 400 and the light-emitting layer 300 may be the same or different, that is, the area of the exciton layer 400 may be greater than that of the light-emitting layer 300, smaller than that of the light-emitting layer 300 or equal to that of the light-emitting layer, which all can achieve that the exciton layer 400 serves as an exciton recombination region and achieves an effect of increasing a density of excitons. As shown in FIG. 3, the singlet-state energy level S1 of the exciton layer 400 is higher than the singlet-state energy level S1 of the host material in the light-emitting layer 300, and the emission spectrum PL of the exciton layer 400 and the absorption spectrum Abs of the host material in the light-emitting layer 300 have the overlapping area, so that energy of excitons formed in the exciton layer 400 can be effectively transferred to the host material and a guest material of the light-emitting layer 300, and the light-emitting efficiency of the light-emitting layer 300 is improved. Moreover, as shown in FIG. 3, the exciton layer 400 allows the triplet-state excitons T1 formed in the exciton layer to form the singlet-state excitons via a reverse intersystem crossing process, so that the exciton layer 400 transfers exciton energy to the S1 energy level of the host material by means of Forrest energy transfer (FET) with a lower energy loss, and Dexter energy transfer (DET) with a greater energy loss is inhibited, thereby being able to effectively improve exciton energy transfer, enhancing the efficiency of the organic electroluminescent device, and reducing roll-off of the device.

In some embodiments, the overlap ratio between the emission spectrum PL of the exciton layer 400 and the absorption spectrum Abs of the host material in the light-emitting layer 300 is generally greater than 5%.

In some embodiments, the larger the overlapping area (the higher the overlap ratio) between the emission spectrum PL of the exciton layer 400 and the absorption spectrum Abs of the host material in the light-emitting layer 300, the more favorable the transfer of the exciton energy from the exciton layer 400 to the light-emitting layer 300, which achieves efficient energy transfer.

In some embodiments, the exciton layer 400 may include one compound, and the compound has a characteristic of emitting thermally activated delayed fluorescence, so as to achieve that the formed triplet-state excitons are formed into the singlet-state excitons in the exciton layer 400 via a reverse intersystem crossing process. Therefore, the exciton layer 400 transfers the exciton energy to the S1 energy level of the host material by means of Forrest energy transfer (FET) with a lower energy loss, and Dexter energy transfer (DET) with a greater energy loss is inhibited, thereby being able to effectively improve exciton energy transfer, and thus enhancing the efficiency of the organic electroluminescent device.

In some embodiments, the exciton layer may also include an exciplex formed by mixing a first compound and a second compound, and an exciton yield PLQY of the exciplex is greater than 50%.

In some embodiments, the higher the exciton yield of the exciplex, the higher the proportion of excitons compounded by the holes and electrons in the exciton layer 400, so as to increase the density of the excitons in the exciton layer 400. A singlet-state energy level S1 of the exciplex is higher than the singlet-state energy level S1 of the host material in the light-emitting layer 300, the energy of the excitons can be effectively transferred to the host material and the guest material of the light-emitting layer 300, and the light-emitting efficiency of the light-emitting layer 300 is improved.

In some embodiments, the compound included by the exciton layer 400 includes, but not limited to, the following materials:

Compound A

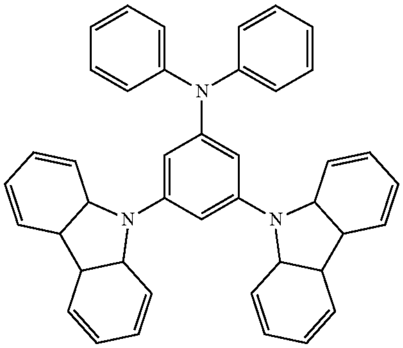

;

Compound B

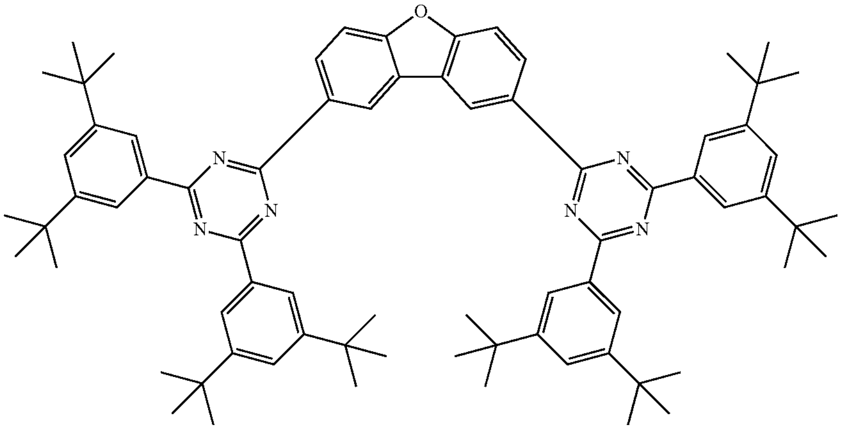

;

Compound C

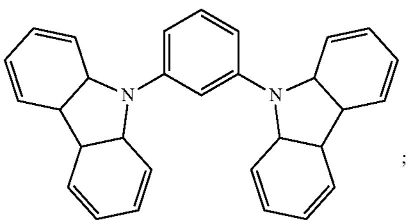

;

Compound D

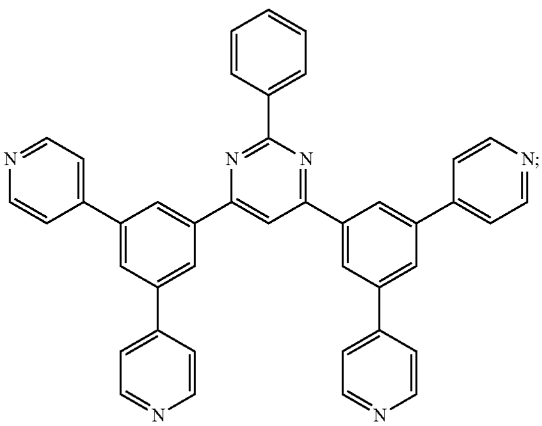

;

-continued
Compound E
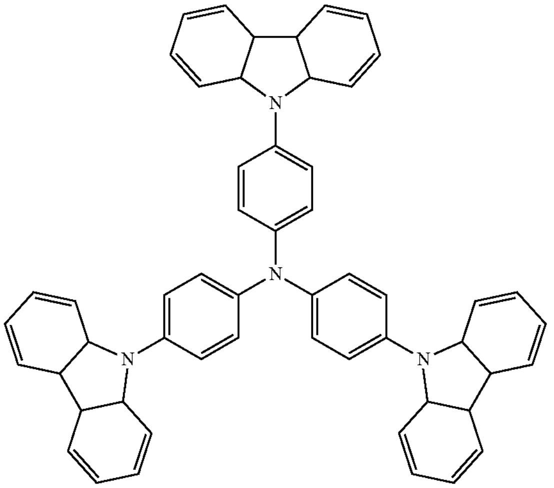
;
Compound F
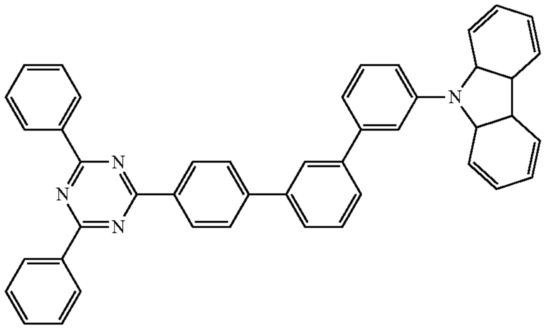
;
Compound G
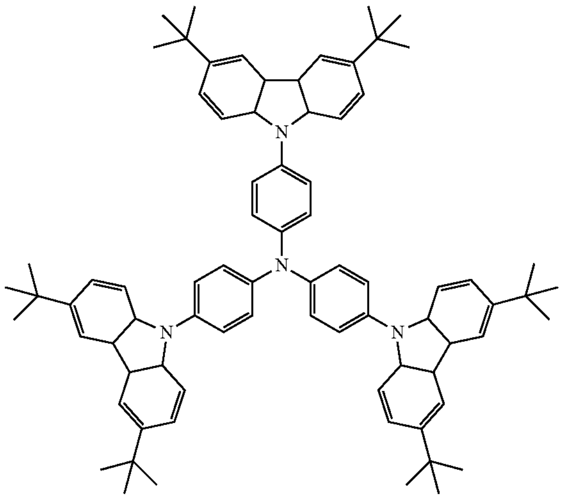
;
Compound H
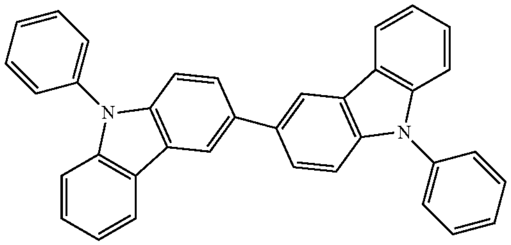
;
Compound I
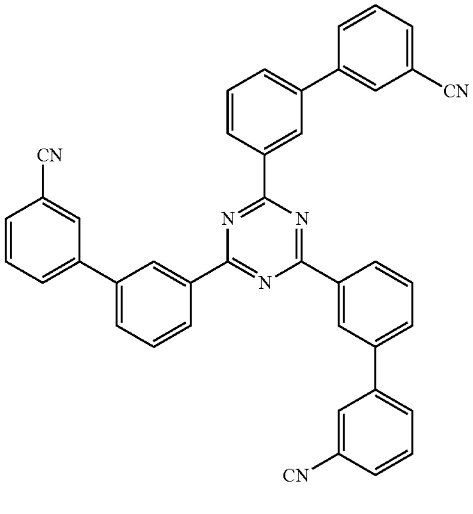
;
Compound J
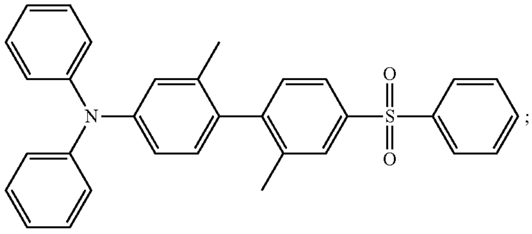
;

-continued

Compound K

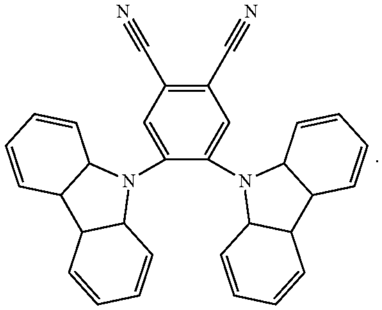

In some embodiments, a mass ratio of the first compound to the second compound is generally controlled to be 1:9-9:1. The proportion of the two may be determined according to the specific material selected, which is not detailed here.

In some embodiments, when an electron mobility of the selected host material in the light-emitting layer 300 is greater than a hole mobility, that is, when the host material in the light-emitting layer 300 is selected from an electronic host material, the electron mobility of the general electronic host material>$1*10^{-6}$ $cm^2/V*S$>the hole mobility, which means that electrons are easily transported from one side of the cathode 200 to one side of the anode 100 through the light-emitting layer 300. Therefore, as shown in FIG. 1, the exciton layer 400 should be arranged on one side of the light-emitting layer 300 facing the anode 100, which is conducive to compounding the electrons and the holes in the exciton layer 400 to achieve the required density of the excitons, so that the energy of the excitons formed in the exciton layer 400 is effectively transferred to the host material and the guest material of the light-emitting layer 300, and the light-emitting efficiency of the light-emitting layer 300 is improved.

In some embodiments, when the electron mobility of the selected host material in the light-emitting layer 300 is smaller than the hole mobility, that is, when the host material in the light-emitting layer 300 is selected from a hole-type host material, the electron mobility of the general hole-type host material<$1*10^{-6}$ $cm^2/V*S$<the hole mobility, which means that holes are easily transported from one side of the anode 100 to one side of the cathode 200 through the light-emitting layer 300. Therefore, as shown in FIG. 2, the exciton layer 400 should be arranged on one side of the light-emitting layer 300 facing the cathode 200, which is conducive to compounding the electrons and the holes in the exciton layer 400 to achieve the required density of the excitons, so that the energy of the excitons formed in the exciton layer 400 is effectively transferred to the host material and the guest material of the light-emitting layer 300, and the light-emitting efficiency of the light-emitting layer 300 is improved.

In some embodiments, as shown in FIG. 1 and FIG. 2, the organic electroluminescent device may further include: at least one auxiliary function layer 500 disposed on a side of the exciton layer 400 facing away from the light-emitting layer 300.

In some embodiments, as shown in FIG. 1, when the exciton layer 400 is disposed on one side of the light-emitting layer 300 facing the anode 100, the auxiliary function layer 500 may include at least one of following: a hole injection layer 501, a hole transport layer 502 or an electron blocking layer 503.

In some embodiments, as shown in FIG. 2, when the exciton layer 400 is disposed on one side of the light-emitting layer 300 facing the cathode 200, the auxiliary function layer 500 may include at least one of following: an electron injection layer 510, an electron transport layer 520 or a hole blocking layer 530.

FIG. 1 and FIG. 2 take the auxiliary function layer 500 including the hole injection layer 501, the hole transport layer 502, the electron blocking layer 503, the electron injection layer 510, the electron transport layer 520 and the hole blocking layer 530 as an example for illustration, and a lamination relationship between film layers is shown in FIG. 1 and FIG. 2. In practical application, the required auxiliary function layer may be selected as required, for example, the electron blocking layer 503 and the hole blocking layer 530 are only selected for the auxiliary function layer 500, which is not detailed here.

In some embodiments, as shown in FIG. 1, the anode 100, the hole injection layer 501, the hole transport layer 502, the electron blocking layer 503, the exciton layer 400, the light-emitting layer 300 including the electronic host material, the hole blocking layer 530, the electron transport layer 520, the electron injection layer 510 and the cathode 200 may be sequentially formed on a base substrate. Alternatively, as shown in FIG. 2, the anode 100, the hole injection layer 501, the hole transport layer 502, the electron blocking layer 503, the light-emitting layer 300 including the hole-type host material, the exciton layer 400, the hole blocking layer 530, the electron transport layer 520, the electron injection layer 510 and the cathode 200 may be sequentially formed on the base substrate.

In some embodiments, the base substrate may be selected from any transparent base material, such as glass, polyimide, etc.

The anode 100 is selected from a high-work function electrode material, and when the organic electroluminescent device provided by the embodiment of the present disclosure is used in a bottom emission structure, transparent oxide ITO, IZO and other materials with a thickness of 80 nm-200 nm may be adopted. When the organic electroluminescent device provided by the embodiment of the present disclosure is used in a top emission structure, it may be manufactured by adopting a composite structure, such as "Ag/ITO" or "Ag/IZO", with a metal layer thickness of 80 nm-100 nm and a metal oxide thickness of 5 nm-10 nm. A reference value of an average reflectivity in a visible region of the anode is 85%-95%, such as transparent oxide ITO, IZO, or a composite electrode formed by Ag/ITO, Ag/IZO, CNT/ITO, CNT/IZO, GO/ITO and GO/IZO.

A main function of the hole injection layer 501 is to reduce a hole injection barrier and improve a hole injection efficiency, and materials such as HATCN and CuPc may be selected to prepare a single-layer film; or hole transport materials may also be prepared by p-type doping, such as NPB:F4TCNQ, TAPC:MnO3, etc. Generally, a thickness of the hole injection layer is 5 nm-20 nm, and a p-type doping concentration is 0.5%-10%.

The hole transport layer 502 may be prepared by evaporation from carbazole materials with a high hole mobility. A highest occupied molecular orbital (HOMO) energy level of a material of the layer should be between −5.2 eV and −5.6 eV, and a reference thickness should be 100 nm-140 nm.

A hole mobility of the electron blocking layer 503 is 1-2 orders of magnitude higher than an electron mobility, it is mainly used to transfer the holes and effectively block transportation of the electrons and excitons generated in the light-emitting layer, and a thickness of the electron blocking layer 503 is selected as 1 nm-10 nm.

An electron mobility of the hole blocking layer 530 is 1-2 orders of magnitude higher than a hole mobility, transportation of the holes can be effectively blocked, the hole blocking layer may be selected from CBP, Bphen, TPBI and other materials, and a thickness of the hole blocking layer is selected as 5 nm-100 nm.

The electron transport layer 520 has a good electron transport characteristic, and may be selected from TmPyPB, B4PyPPM and other materials, and a thickness of the electron transport layer is selected as 20 nm-100 nm.

The electron injection layer 510 may be selected from LiF, Yb, LiQ and other materials, and a thickness of the electron injection layer is selected as 1 nm-10 nm.

The cathode 200 may be selected from Mg, Ag and other materials.

In some embodiments, as shown in FIG. 1 and FIG. 2, the singlet-state energy level S1 of the exciton layer 400 is generally smaller than a singlet-state energy level S1 of the adjacent auxiliary function layer 500 of the at least one auxiliary function layer. For example, in a structure shown in FIG. 1, the singlet-state energy level S1 of the exciton layer 400 is smaller than a singlet-state energy level S1 of the electron blocking layer 503; and in a structure shown in FIG. 2, the singlet-state energy level S1 of the exciton layer 400 is smaller than a singlet-state energy level S1 of the hole blocking layer 530.

In some embodiments, the singlet-state energy level S1 of the exciton layer 400 is generally smaller than the singlet-state energy level S1 of the adjacent auxiliary function layer 500 of the at least one auxiliary function layer, the energy can be prevented from being transferred from the exciton layer 400 to the adjacent film layer, excitons can be effectively limited in the exciton layer 400 and then transferred to the light-emitting layer 300, and the light-emitting efficiency is improved.

In some embodiments, as shown in FIG. 1 and FIG. 2, an Lowest Unoccupied Molecular Orbital, LUMO, value of the at least one compound in the exciton layer 400 is generally greater than an LUMO value of the adjacent auxiliary function layer 500 of the at least one auxiliary function layer. For example, in the structure shown in FIG. 1, the LUMO value of the compound in the exciton layer 400 is greater than an LUMO value of the electron blocking layer 503; and in the structure shown in FIG. 2, the LUMO value of the compound in the exciton layer 400 is greater than an LUMO value of the hole blocking layer 530. It is worth noting that the LUMO value refers to an absolute value of an LUMO energy level.

In some embodiments, the LUMO value of the compound in the exciton layer 400 is greater than the LUMO value of the adjacent auxiliary function layer 500, the excitons can be prevented from transitioning from the exciton layer 400 to the adjacent film layer, the excitons can be effectively limited in the exciton layer 400 and then transferred to the light-emitting layer 300, and the light-emitting efficiency is improved. Moreover, when the exciton layer 400 includes a plurality of compounds, the LUMO value of each compound needs to be greater than the LUMO value of the adjacent auxiliary function layer 500.

In some embodiments, an absolute value of a difference between the LUMO value of the at least one compound in the exciton layer 400 and the LUMO value of the adjacent auxiliary function layer 500 is greater than 0.3 eV. In the structure shown in FIG. 1, an absolute value of a difference between the LUMO value of the compound in the exciton layer 400 and the LUMO value of the electron blocking layer 503 is greater than 0.3 eV. When the exciton layer 400 includes two compounds, $|LUMO_{first\ compound}|-|LUMO_{electron\ blocking\ layer}|>0.3$ eV, and $|LUMO_{second\ compound}|-|LUMO_{electron\ blocking\ layer}|>0.3$ eV. In the structure shown in FIG. 2, an absolute value of a difference between the LUMO value of the compound in the exciton layer 400 and the LUMO value of the hole blocking layer 530 is greater than 0.3 eV. When the exciton layer 400 includes two compounds, $|LUMO_{first\ compound}|-|LUMO_{hole\ blocking\ layer}|>0.3$ eV, and $|LUMO_{second\ compound}|-|LUMO_{hole\ blocking\ layer}|>0.3$ eV.

An absolute value of a difference between an Highest Occupied Molecular Orbital, HOMO, value of the at least one compound in the exciton layer 400 and an HOMO value of the adjacent auxiliary function layer 500 is smaller than 0.5 eV. In the structure shown in FIG. 1, an absolute value of a difference between the HOMO value of the compound in the exciton layer 400 and an HOMO value of the electron blocking layer 503 is smaller than 0.5 eV. When the exciton layer 400 includes two compounds, $|HOMO_{first\ compound}|-|HOMO_{electron\ blocking\ layer}|<0.5$ eV, and $|HOMO_{first\ compound}|-|HOMO_{electron\ blocking\ layer}|<0.5$ eV. In the structure shown in FIG. 2, an absolute value of a difference between the HOMO value of the compound in the exciton layer 400 and an HOMO value of the hole blocking layer 530 is smaller than 0.5 eV. When the exciton layer 400 includes two compounds, $|HOMO_{first\ compound}|-|HOMO_{hole\ blocking\ layer}|<0.5$ eV, and $|HOMO_{second\ compound}|-|HOMO_{hole\ blocking\ layer}|<0.5$ eV.

In some embodiments, a thickness of the exciton layer 400 is generally smaller than or equal to 20 nm. The thickness of the exciton layer 400 should not be excessively large, so as to prevent the situation that exciton energy of the exciton layer 400 cannot be fully transferred to the light-emitting layer 300.

In some embodiments, three groups of embodiments and corresponding comparative examples are prepared by adopting the structure of the organic electroluminescent device provided by the embodiment of the present disclosure. Materials of the hole injection layer HIL, the hole transport layer HTL, the hole blocking layer HBL, the electron transport layer ETL and the cathode in the comparative examples and the embodiments are the same, and thicknesses are slightly different. In the first group of embodiment 1 and corresponding comparative examples 1-3, the light-emitting layer adopts a blue light-emitting material, that is, the light-emitting layer includes a blue host material BH and a blue guest material BD of 5 wt %, and the material and thickness of the exciton layer are adjusted. In the second group of embodiment 2 and corresponding comparative examples 4-6, the light-emitting layer adopts a green light-emitting material, that is, the light-emitting layer includes a green host material GH and a green guest material GD of 1.5 wt %, and the material and thickness of the exciton layer are adjusted. In the third group of embodiment 3 and corresponding comparative example 7, the light-emitting layer adopts a red light-emitting material, that is, the light-emitting layer includes a red host material RH and a red guest material RD of 3 wt %, and the thickness of the exciton layer is adjusted. Detail parameters are shown in Table 1.

TABLE 1

| | HIL | HTL | Exciton layer (1:1) | Light-emitting layer 20 nm | HBL | ETL | Cathode Mg:Ag (9:1) |
|---|---|---|---|---|---|---|---|
| Embodiment 1 | 10 nm | 120 nm | Compound A and compound B 3 nm | BH and BD (5 wt %) | 5 nm | 40 nm | 150 nm |
| Comparative example 1 | 10 nm | 120 nm | Non | BH and BD (5 wt %) | 5 nm | 40 nm | 150 nm |
| Comparative example 2 | 10 nm | 120 nm | Compound A and compound B 10 nm | BH and BD (5 wt %) | 5 nm | 40 nm | 150 nm |
| Comparative example 3 | 10 nm | 120 nm | Compound C and compound D 3 nm | BH and BD (5 wt %) | 5 nm | 40 nm | 150 nm |
| Embodiment 2 | 10 nm | 120 nm | Compound E and compound F 3 nm | GH and GD (1.5 wt %) | 5 nm | 50 nm | 100 nm |
| Comparative example 4 | 10 nm | 120 nm | Non | GH and GD (1.5 wt %) | 5 nm | 50 nm | 100 nm |
| Comparative example 5 | 10 nm | 120 nm | Compound F and compound G 3 nm | GH and GD (1.5 wt %) | 5 nm | 50 nm | 100 nm |
| Comparative example 6 | 10 nm | 120 nm | Compound H and compound I 3 nm | GH and GD (1.5 wt %) | 5 nm | 50 nm | 100 nm |
| Embodiment 3 | 10 nm | 100 nm | Compound J and compound K 3 nm | RH and RD (3 wt %) | 5 nm | 50 nm | 100 nm |
| Comparative example 7 | 10 nm | 100 nm | Non | RH and RD (3 wt %) | 5 nm | 50 nm | 100 nm |

The device performances of the three groups of embodiments are compared from the following data: turn-on voltage Von, current efficiency CE, and luminescence wave length $\lambda_{EL}$, and the specific measured data are shown in Table 2.

TABLE 2

| | Turn-on voltage (V) | CE (cd/A) | $\lambda_{EL}$ (nm) |
|---|---|---|---|
| Embodiment 1 | 3.7 | 9.0 | 468 |
| Comparative example 1 | 3.6 | 6.8 | 468 |
| Comparative example 2 | 3.8 | 8.4 | 469 |
| Comparative example 3 | 3.8 | 6.0 | 468 |
| Embodiment 2 | 3.0 | 63.8 | 536 |
| Comparative example 4 | 2.8 | 50.0 | 536 |
| Comparative example 5 | 2.9 | 45.1 | 537 |
| Comparative example 6 | 3.0 | 68.4 | 538 |
| Embodiment 3 | 4.6 | 21.8 | 618 |
| Comparative example 7 | 4.5 | 19.5 | 618 |

The device performance of embodiment 1, comparative example 1 and comparative example 2 in the first group of embodiments, the device performance of embodiment 2 and comparative example 4 in the second group of embodiments, and the device performance of embodiment 3 and comparative example 7 in the third group of embodiments show that the existence of the exciton layer 400 improves the device efficiency because the exciton layer increases the density of the singlet-state excitons and the excitons are transferred to the light-emitting layer through energy transfer to emit light.

Figure 4:
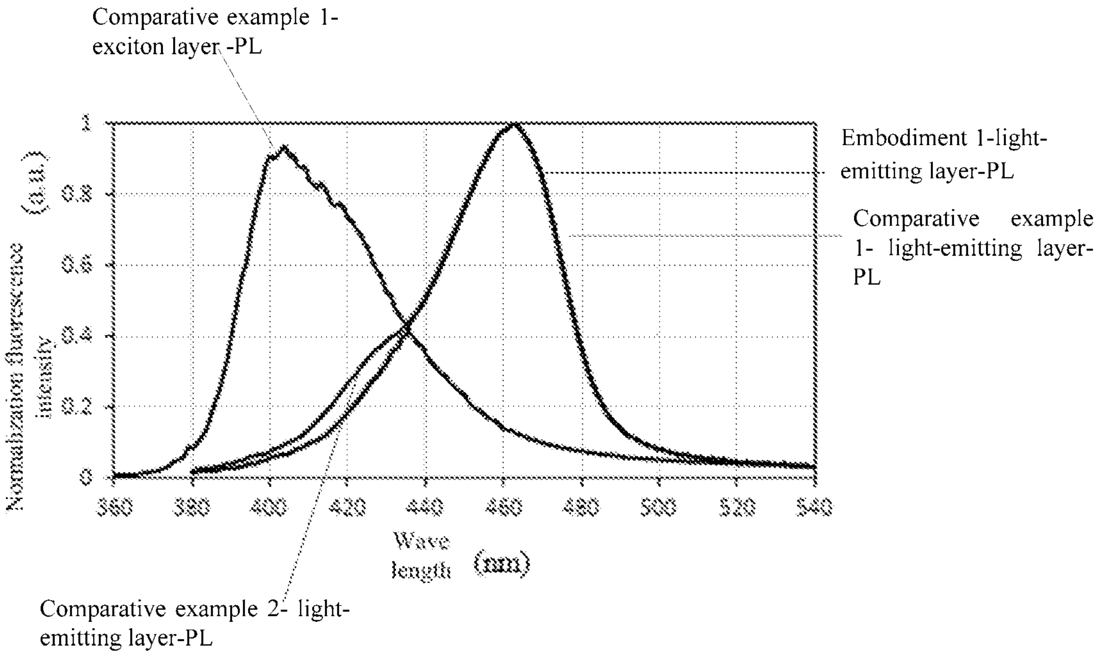
FIG. 4 is a diagram of an absorption-emission relation of each embodiment in experimental data provided by an embodiment of the present disclosure.

It can be seen from a spectrum diagram shown in FIG. 4, when the thickness of the exciton layer 400 in embodiment 1 is 3 nm, the emission spectrum of the device coincides with that in comparative example 1, and it is indicated that the exciton layer 400 does not emit. When the thickness of the exciton layer in comparative example 2 is 10 nm, there is weak emission of the exciton layer 400 in the emission spectrum of the device, and it is indicated that exciton energy transfer of the exciton layer 400 is insufficient, which may be caused by increase of the thickness of the exciton layer 400.

Figure 5:
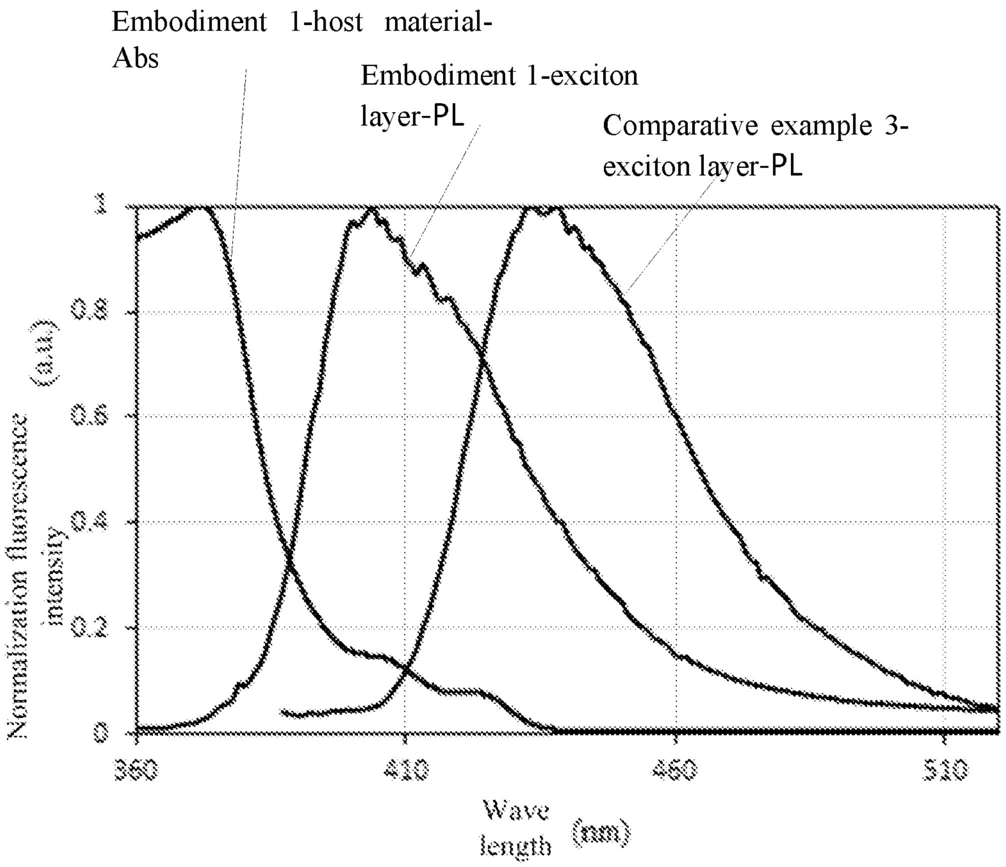
FIG. 5 is a diagram of an absorption-emission relation of each embodiment in experimental data provided by an embodiment of the present disclosure.

By comparing embodiment 1 and comparative example 3, the device performance of embodiment 1 is higher than that of comparative example 3, as shown in FIG. 5, which may be caused by a situation that exciton energy transfer is easier because an overlap between the emission spectrum (PL) of the exciton layer and the absorption spectrum (Abs) of the host material of the light-emitting layer in embodiment 1 is larger.

It can be seen from data parameters shown in Table 2 and Table 3 that comparing embodiment 2, comparative example 5 and comparative example 6, the device performance of embodiment 2 is the best. The reason may be that the highest PLQY of an exciplex in the exciton layer of embodiment 2 leads to the highest exciton yield, so the device efficiency of embodiment 2 is the highest.

TABLE 3

| | Material of exciton layer 3 nm | Exciton layer-PL | Host material-Abs | ΔPeak | Exciton layer-PLQY |
|---|---|---|---|---|---|
| Embodiment 1 | Compound A:compound B | 409 nm | 373 nm | 36 nm | 68% |
| Comparative example 3 | Compound C:compound D | 440 nm | 373 nm | 67 nm | 71% |
| Embodiment 2 | Compound E:compound F | 520 nm | 492 nm | 28 nm | 64% |
| Comparative example 5 | Compound F:compound G | 515 nm | 492 nm | 23 nm | 43% |
| Comparative example 6 | Compound H:compound I | 510 nm | 492 nm | 18 nm | 54% |
| Embodiment 3 | Compound J:compound K | 550 nm | 576 nm | 26 nm | 79% |

Based on the same inventive concept, an embodiment of the present disclosure further provides a display panel, including the plurality of above organic electroluminescent devices provided by the embodiment of the present disclosure. Since a problem solving principle of the display panel is similar to the above organic electroluminescent device, for implementation of the display panel, reference may be made to implementation of the organic electroluminescent device, and repetition will not be made.

Based on the same inventive concept, an embodiment of the present disclosure further provides a display apparatus, including the above display panel provided by the embodiment of the present disclosure. The display apparatus may be any products or components with display functions such as a mobile phone, a tablet computer, a television, a monitor, a notebook computer, a digital photo frame and a navigator. Other essential components of the display apparatus should be understood by those skilled in the art, and will not repeated herein, nor should it be used as a limitation of the present disclosure. For implementation of the display apparatus, reference may be made to implementation of the above organic electroluminescent device, and repetition will not be made.

According to the above organic electromagnetic device, display panel, and display apparatus provided by embodiments of the present disclosure, the exciton layer adjacent to the light-emitting layer is added, and the exciton layer serves as the exciton recombination region and achieves the effect of increasing the density of the excitons. The singlet-state energy level of the exciton layer is higher than the singlet-state energy level of the host material in the light-emitting layer, and the emission spectrum of the exciton layer and the absorption spectrum of the host material in the light-emitting layer have the overlapping area, so that energy of the excitons formed in the exciton layer can be effectively transferred to the host material and the guest material of the light-emitting layer, and the light-emitting efficiency of the light-emitting layer is improved. Moreover, the exciton layer allows the triplet-state excitons formed in the exciton layer to form the singlet-state excitons via a reverse intersystem crossing process, so that the exciton layer transfers exciton energy to the energy level of the host material by means of the Forrest energy transfer with the lower energy loss, and the Dexter energy transfer with the greater energy loss is inhibited, thereby effectively improving exciton energy transfer, and enhancing the efficiency of the organic electroluminescent device.

Obviously, those skilled in the art can make various changes and modifications to the embodiments of the present disclosure without departing from the spirit and scope of the embodiments of the present disclosure. As such, provided that these modifications and variations of the embodiments of the present disclosure fall within the scope of the claims of the present disclosure and their equivalents, the present disclosure is also intended to cover such modifications and variations.

What is claimed is:

1. An organic electroluminescent device, comprising:
- an anode and a cathode, arranged in opposite;
- a light-emitting layer, between the anode and the cathode; and
- an exciton layer, adjacent to the light-emitting layer, wherein the exciton layer, the light-emitting layer, the anode and the cathode are arranged in a stacked manner; wherein
- the exciton layer allows triplet-state excitons formed in the exciton layer to form singlet-state excitons via a reverse intersystem crossing process;
- a singlet-state energy level of the exciton layer is higher than a singlet-state energy level of a host material in the light-emitting layer, and
- an overlap ratio between an emission spectrum of the exciton layer and an absorption spectrum of the host material in the light-emitting layer is greater than a set value;
- wherein the exciton layer consists of one compound; and
- the compound has a characteristic of emitting thermally activated delayed fluorescence.

2. The organic electroluminescent device according to claim 1, wherein the overlap ratio between the emission spectrum of the exciton layer and the absorption spectrum of the host material in the light-emitting layer is greater than 5%.

3. The organic electroluminescent device according to claim 1, wherein an electron mobility of the host material in the light-emitting layer is greater than a hole mobility of the host material in the light-emitting layer, and the exciton layer is disposed on a side of the light-emitting layer facing the anode; or
- the electron mobility of the host material in the light-emitting layer is smaller than the hole mobility of the host material in the light-emitting layer, and the exciton layer is disposed on a side of the light-emitting layer facing the cathode.

4. The organic electroluminescent device according to claim 3, further comprising: at least one auxiliary function layer disposed on a side of the exciton layer facing away from the light-emitting layer; wherein
- the singlet-state energy level of the exciton layer is smaller than a singlet-state energy level of an adjacent auxiliary function layer of the at least one auxiliary function layer.

5. The organic electroluminescent device according to claim 1, further comprising: at least one auxiliary function layer disposed on a side of the exciton layer facing away from the light-emitting layer; wherein
- an Lowest Unoccupied Molecular Orbital, LUMO, value of the at least one compound in the exciton layer is greater than an LUMO value of an adjacent auxiliary function layer of the at least one auxiliary function layer.

6. The organic electroluminescent device according to claim 5, wherein an absolute value of a difference between the LUMO value of the at least one compound in the exciton layer and the LUMO value of the adjacent auxiliary function layer is greater than 0.3 eV; and an absolute value of a difference between an Highest Occupied Molecular Orbital, HOMO, value of the at least one compound in the exciton layer and an HOMO value of the adjacent auxiliary function layer is smaller than 0.5 eV.

7. The organic electroluminescent device according to claim 4, wherein when the exciton layer is disposed on the side of the light-emitting layer facing the anode, the at least one auxiliary function layer comprises at least one of following: a hole injection layer, a hole transport layer or an electron blocking layer; or when the exciton layer is disposed on the side of the light-emitting layer facing the cathode, the at least one auxiliary function layer comprises at least one of following: an electron injection layer, an electron transport layer or a hole blocking layer.

8. The organic electroluminescent device according to claim 1, wherein a thickness of the exciton layer is smaller than or equal to 20 nm.

9. A display panel, comprising a plurality of organic electroluminescent devices, wherein each of the plurality of organic electroluminescent devices is according to claim 1.

10. A display apparatus, comprising: the display panel according to claim 9.

11. The organic electroluminescent device according to claim 5, wherein when the exciton layer is disposed on the side of the light-emitting layer facing the anode, the at least one auxiliary function layer comprises at least one of following: a hole injection layer, a hole transport layer or an electron blocking layer; or when the exciton layer is disposed on the side of the light-emitting layer facing the cathode, the at least one auxiliary function layer comprises at least one of following: an electron injection layer, an electron transport layer or a hole blocking layer.

12. The display panel according to claim 9, wherein the overlap ratio between the emission spectrum of the exciton layer and the absorption spectrum of the host material in the light-emitting layer is greater than 5%.

13. The display panel according to claim 9, wherein an electron mobility of the host material in the light-emitting layer is greater than a hole mobility of the host material in the light-emitting layer, and the exciton layer is disposed on a side of the light-emitting layer facing the anode; or the electron mobility of the host material in the light-emitting layer is smaller than the hole mobility of the host material in the light-emitting layer, and the exciton layer is disposed on a side of the light-emitting layer facing the cathode.

14. The display panel according to claim 13, the organic electroluminescent device further comprising: at least one auxiliary function layer disposed on a side of the exciton layer facing away from the light-emitting layer; wherein the singlet-state energy level of the exciton layer is smaller than a singlet-state energy level of an adjacent auxiliary function layer of the at least one auxiliary function layer.

* * * * *